United States Patent [19]
Tseng

[11] Patent Number: 5,716,883
[45] Date of Patent: Feb. 10, 1998

[54] METHOD OF MAKING INCREASED SURFACE AREA, STORAGE NODE ELECTRODE, WITH NARROW SPACES BETWEEN POLYSILICON COLUMNS

[75] Inventor: Horng-Huei Tseng, Hsinchu, Taiwan

[73] Assignee: Vanguard International Semiconductor Corporation, Hsin-chu, Taiwan

[21] Appl. No.: 746,060

[22] Filed: Nov. 6, 1996

[51] Int. Cl.[6] .............................................. H01L 21/8242
[52] U.S. Cl. .................................... 438/253; 438/657
[58] Field of Search .................................. 438/253, 254, 438/255, 396, 397, 398, 657, 684

[56] References Cited

U.S. PATENT DOCUMENTS

| | | | |
|---|---|---|---|
| 5,290,729 | 3/1994 | Hayashide et al. | 438/255 |
| 5,447,882 | 9/1995 | Kim | 438/396 |
| 5,468,670 | 11/1995 | Ryou | 438/253 |
| 5,494,841 | 2/1996 | Dennison et al. | 438/253 |

*Primary Examiner*—Chandra Chaudhari
*Attorney, Agent, or Firm*—George O. Saile; Stephen B. Ackerman

[57] ABSTRACT

A method of creating an STC structure, used for high density, DRAM designs, has been developed. The process consists of creating a storage node electrode, for the STC structure, consisting of an upper polysilicon shape, comprised of polysilicon columns, with a narrow space between polysilicon columns, and an underlying lower polysilicon shape, residing in a contact hole, and making contact to underlying transistor regions. The polysilicon columns, and the narrow space, between polysilicon columns are formed via creation of a narrow trench in a top portion of a polysilicon layer, followed by an anisotropic etch to create the exterior shape of the storage node electrode. A key feature of this invention is the use of a photoresist plug, in the trench, used to protect the lower portion of the storage node electrode during the exterior shape, patterning process. This storage node electrode configuration results in increased surface area, via use of polysilicon columns, as well as density improvements, resulting from the use of narrow spaces between polysilicon columns.

31 Claims, 5 Drawing Sheets

METHOD OF MAKING INCREASED SURFACE AREA, STORAGE NODE ELECTRODE, WITH NARROW SPACES BETWEEN POLYSILICON COLUMNS

BACKGROUND OF THE INVENTION

(1) Field of the Invention

The present invention relates to a method used to fabricate high density, semiconductor, DRAM cells, with stacked capacitor structures, and more specifically to a fabrication process used to increase the surface area of a storage node electrode, used in the stacked capacitor structure.

(2) Description of the Prior Art

Device performance and cost reductions are the major objectives of the semiconductor industry. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source or drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Hayashide, in U.S. Pat. No. 5,290,729, describes a storage node, or lower electrode, of an STC structure, in which the surface area of the lower electrode is increased via growth of HSG polysilicon, on the top surface of the lower electrode. However the HSG polysilicon process can be difficult to control, based on the narrow range of deposition and anneal conditions, needed to obtain the desired HSG characteristics. Another method used for achieving the desired electrode surface area is the creation of the lower electrodes with protruding shapes of polysilicon, or polysilicon columns, thus resulting in a greater electrode surface area then would have been achieved with conventional flat surfaces. Kim, in U.S. Pat. No. 5,447,882, describes such an STC structure, comprised of a lower electrode, formed by creating protruding polysilicon shapes, or columns, via patterning of a polysilicon layer. However for the Kim invention, a minimum space between polysilicon columns is not highlighted, and therefore a process of obtaining minimum spacing between protruding polysilicon columns is not detailed. Minimum spacing between polysilicon columns will result in a smaller STC structure, and thus allow greater DRAM designs to be realized.

This invention will describe a process in which a storage node electrode, or lower electrode of an STC structure is also fabricated using protruding polysilicon shapes, or columns, with a detailed process describing the attainment of storage node electrodes, however this invention will include a process that allows a minimum of spacing between protruding polysilicon columns to be achieved. The decrease in spacing between protruding polysilicon columns, allows a narrower storage node electrode to be manufactured, therefore allowing density improvements to be realized, while still benefitting, in terms of increased capacitance, from the protruding polysilicon columns. The narrower spacing between polysilicon columns, in this invention, is obtained by initially creating a trench in a top portion of a polysilicon layer, using a narrow opening in an overlying dielectric layer as a mask, with insulator spacers on the sides of the opening, used to further decrease the width of the opening. After creation of the trench in the top portion of the polysilicon layer, the trench dimension will ultimately be equal to the narrow spacing between polysilicon columns a thick photoresist layer is applied and exposed at conditions needed to develop all of the photoresist layer, except for a portion of the photoresist layer residing in the trench, located in the top portion of the polysilicon layer. After removal of the dielectric layer, a blanket, anisotropic etch procedure forms the storage node electrode, comprised of a bottom portion of polysilicon layer, residing in a capacitor contact hole, and protected, during the anisotropic etching, by the unexposed photoresist in the trench, and also comprised of overlying, polysilicon columns, also patterned during the anisotropic etching, and masked with the insulator spacers. This invention allows narrow spaces between polysilicon columns to be obtained and also eliminates the use of a photolithographic masking procedure, used for patterning of the storage node electrode.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to form the storage node electrode, of the STC structure by creating a lower portion of the polysilicon, storage node electrode, in a capacitor contact hole, contacting a region of an underlying transfer gate transistor, while simultaneously creating an upper portion of the storage node electrode, comprised of polysilicon columns, overlying the lower portion of the storage node electrode, and extending upwards, with a narrow space between polysilicon columns.

It is yet another object of this invention to simultaneously create the upper and lower portions of the storage node electrode, via a blanket, anisotropic etching procedure, using an unexposed photoresist plug, protecting a portion of the lower portion of the storage node electrode, and silicon oxide spacers defining the polysilicon columns, during the etching procedure, thus eliminating the need for a photolithographic masking procedure.

It is still yet another object of this invention to use insulator spacers to define the width of the polysilicon columns, and to use a narrow opening in a dielectric layer, with insulator spacers on the sides of the narrow opening in the dielectric layer, to define the space between polysilicon columns.

In accordance with the present invention a method for fabricating increased capacitance DRAM devices, via use of an STC structure, comprised of a storage node electrode with increased surface area, has been developed. A transfer gate transistor comprised of: a thin gate insulator; a polysilicon gate structure formed from an overlying, first silicon oxide layer and an underlying, first polysilicon layer; lightly doped source and drain regions; insulator spacers on the sidewalls of the polysilicon gate structure, formed from a second silicon oxide layer; and heavily doped source and drain regions; are formed on a semiconductor substrate. A third layer of silicon oxide is deposited on the transfer gate transistor region, followed by a contact hole opening, in the third silicon oxide layer, exposing a source and drain region of the transfer gate transistor. A second polysilicon layer is deposited, completely filling the contact hole opening, and contacting the source and drain region of the transfer gate transistor. A layer of silicon nitride is deposited on the second polysilicon layer, followed by photolithographic and reactive ion etching procedures, used to open a narrow hole in the silicon nitride layer, exposing the top surface of underlying, second polysilicon layer. A fourth silicon oxide layer is deposited and subjected to anisotropic, reactive ion etching, (RIE), processing to form silicon oxide spacers on the sides of the narrow hole opening, in the silicon nitride layer, further decreasing the width of the narrow hole opening. Blanket, anisotropic RIE procedures are next used to create a narrow width trench, in a top portion of the second polysilicon layer, using the narrow hole opening, in the silicon nitride layer, with the silicon oxide spacers on the sides of the silicon nitride, as a mask. A photoresist layer is next applied, and exposed at conditions that allow all of the photoresist layer, except a photoresist plug in the narrow width trench, in the top portion of the second polysilicon layer, to be developed. After selective removal of the silicon nitride layer, another blanket anisotropic, RIE procedure is employed to pattern the storage node electrode, removing second polysilicon layer in regions not protected by either silicon oxide spacers or by the photoresist plug. The storage node electrode is comprised of polysilicon columns, formed using the overlying silicon oxide spacers as a mask during the blanket anisotropic RIE procedure, and separated by a space provided by the narrow width trench, in the second polysilicon layer, which was protected during the etch procedure by the photoresist plug. Removal of the photoresist plug, and of the silicon oxide spacers, are followed by creation of a capacitor dielectric layer, on the storage node electrode, and subsequent formation of an upper electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a storage node electrode, comprised of polysilicon columns, with a minimum of spacing between polysilicon columns, will now be described. The transfer gate transistor, used for this DRAM device, in this invention, will be an N channel device. However the STC structure, with the increased surface area described in this invention, can also be applied to P channel, transfer gate transistor.

Figure 1:
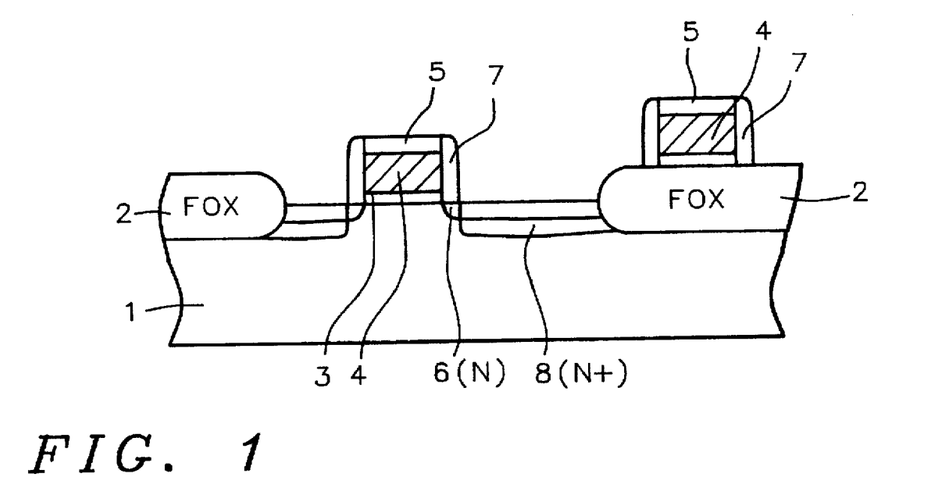
FIGS. 1–9, which schematically shows, in cross-sectional style, the key fabrication stages used in the creation of a DRAM device, with a STC structure, with an increased surface area, resulting from a storage node electrode structure comprised of polysilicon columns, with narrow spaces between the polysilicon columns.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon layer can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 800 to 1600 Angstroms. Conventional photolithographic and reactive ion etching, (RIE), procedures, using CHF$_3$ as an etchant for silicon oxide layer, 5, and using Cl$_2$ as an etchant for polysilicon layer, 4, are used to create the polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 30 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E15 to 5E16 atoms/cm$^2$. The result of these procedures are schematically shown in FIG. 1.

Figure 2:
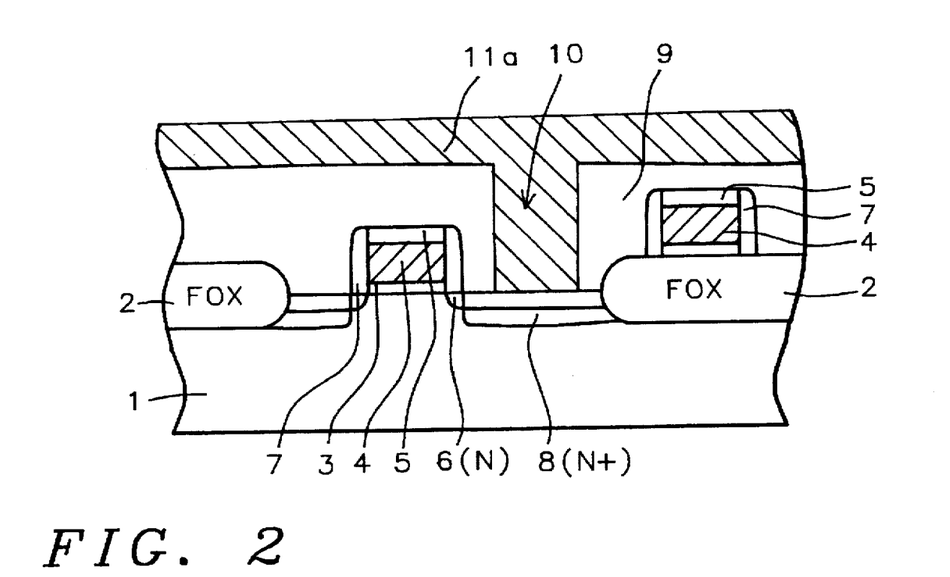

A third insulator layer of silicon oxide, 9, is next deposited via LPCVD or PECVD procedures, at a temperature between about 700 to 750° C., to a thickness between about 3000 to 8000 Angstroms. Chemical mechanical polishing, (CMP), procedures are next used to planarize silicon oxide layer, 9. Conventional photolithographic and RIE procedures, using CHF$_3$ as an etchant, are used to open contact hole, 10, in silicon oxide layer, 9, to be used for the capacitor contact exposing the top surface of heavily doped source and drain region, 8, shown schematically in FIG. 2. Photoresist removal is performed via use of plasma oxygen ashing and careful wet cleans. A second layer of polysilicon, 11a, is next deposited, via LPCVD procedures, at a temperature between about 500° to 700° C., to a thickness between about 3000 to 8000 Angstroms. The second polysilicon layer is deposited using in situ doping procedures, via the addition of either phosphine or arsine, to a silane ambient. The result of the second polysilicon deposition is schematically shown in FIG. 2.

Figure 3:
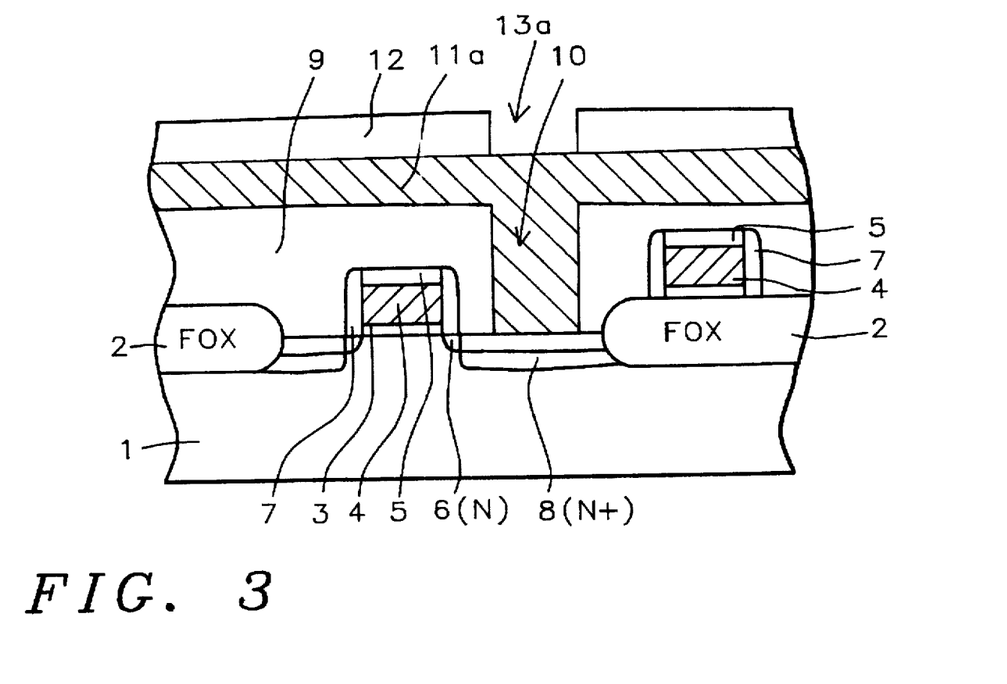
Figure 4:
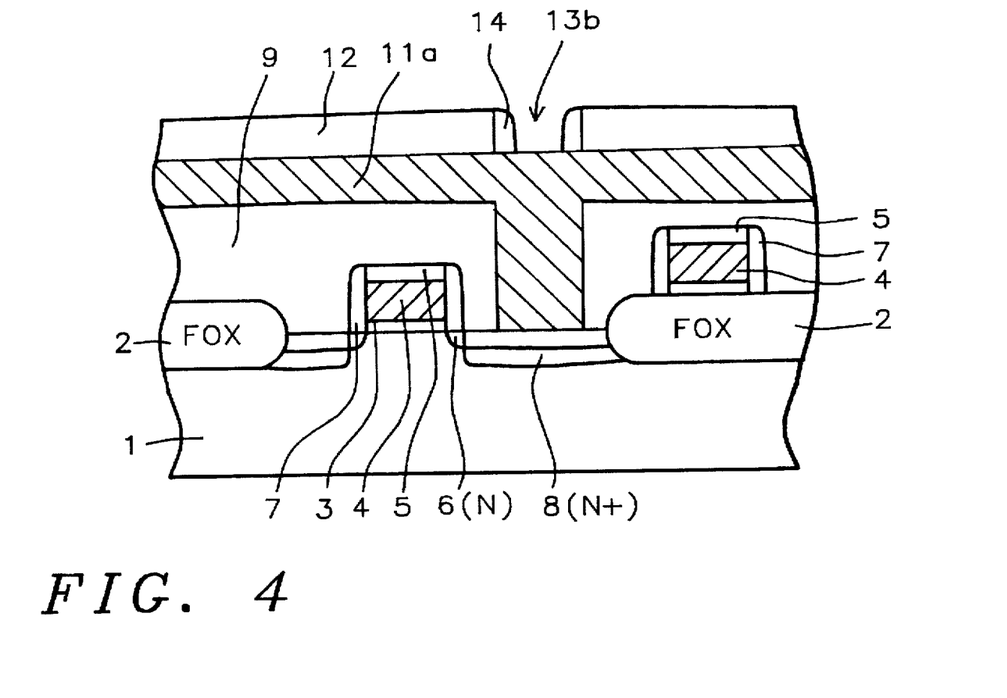

A layer of silicon nitride, 12, is next deposited, at a temperature between about 700° to 750° C., to a thickness between about 1000 to 2500 Angstroms. Photolithographic and RIE procedures, using $CHF_3$ as an etchant, are used to open a first narrow hole, 13a, in silicon nitride layer, 12, shown schematically in FIG. 3. The width of opening, 13a, is critical in subsequently obtaining a minimum spacing between polysilicon columns, with the minimum spacing between subsequent polysilicon columns, needed to maintain a narrow width STC structure. Therefore first narrow hole, 13a, is further shrunk by creating silicon oxide spacers, 14, on the sides of the first narrow hole, 13a. The silicon oxide spacers are created via deposition of a silicon oxide layer, via either LPCVD or PECVD procedures, at a temperature between about 700° to 750° C., to a thickness between about 1000 to 2500 Angstroms, followed by a blanket, (unmasked), anisotropic RIE procedure, using $CHF_3$ as an etchant, creating silicon oxide spacers, 14. Second narrow hole, 13b, created having a width reduced by the thickness of silicon oxide spacers, 14, is shown schematically in FIG. 4. Second narrow hole opening, 13b, is narrower then counterparts that can be obtained using only advanced lithography procedures.

Figure 5:
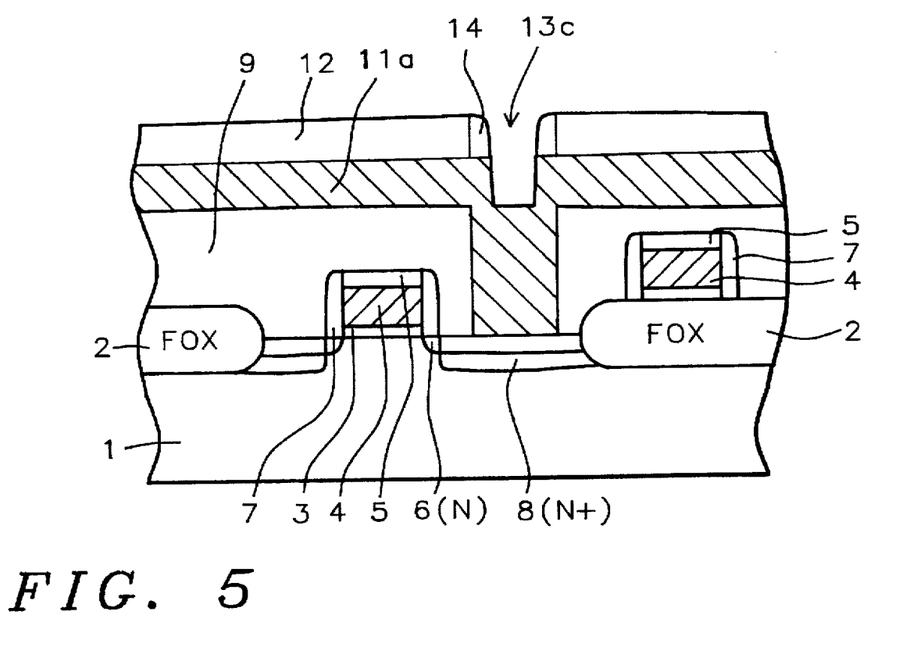

A selective, (removing polysilicon at a faster rate then removal of either silicon oxide or silicon nitride), blanket, anisotropic RIE procedure, using HBr or $Cl_2$ as an etchant, is used to create trench, 13c, in second polysilicon layer, 11a. Trench, 13c, in second polysilicon layer, 11a, is created using second narrow hole, 13b, as a mask, and therefore is identical in width to second narrow hole, 13b. The depth of trench, 13c, is between about 2000 to 5000 Angstroms, below the top surface of second polysilicon layer, 11a. The surface area increase of the subsequent storage node electrode increases with increasing trench depth. The result of the trench formation is schematically shown in FIG. 5.

Figure 6:
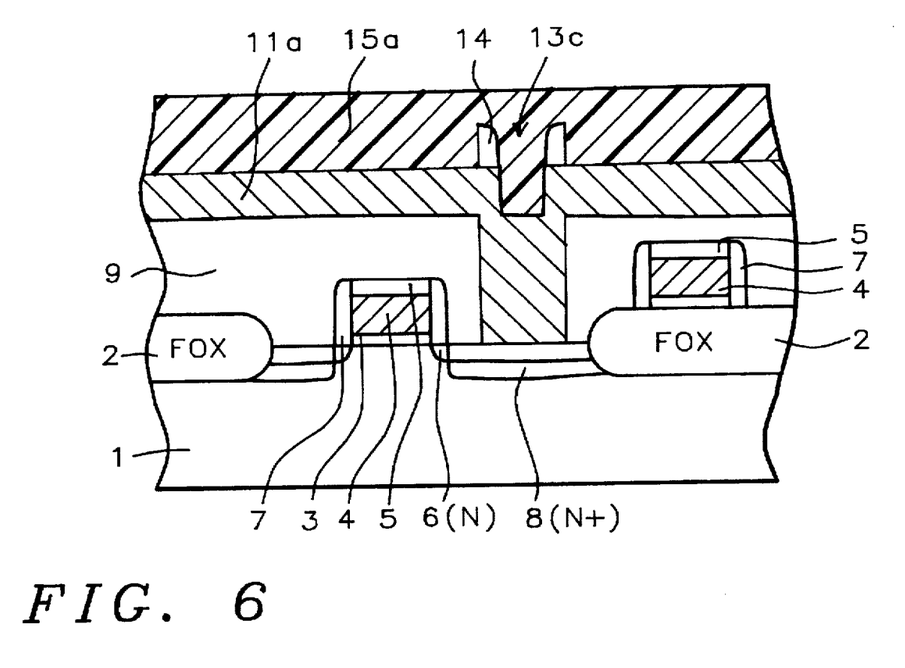
Figure 7:
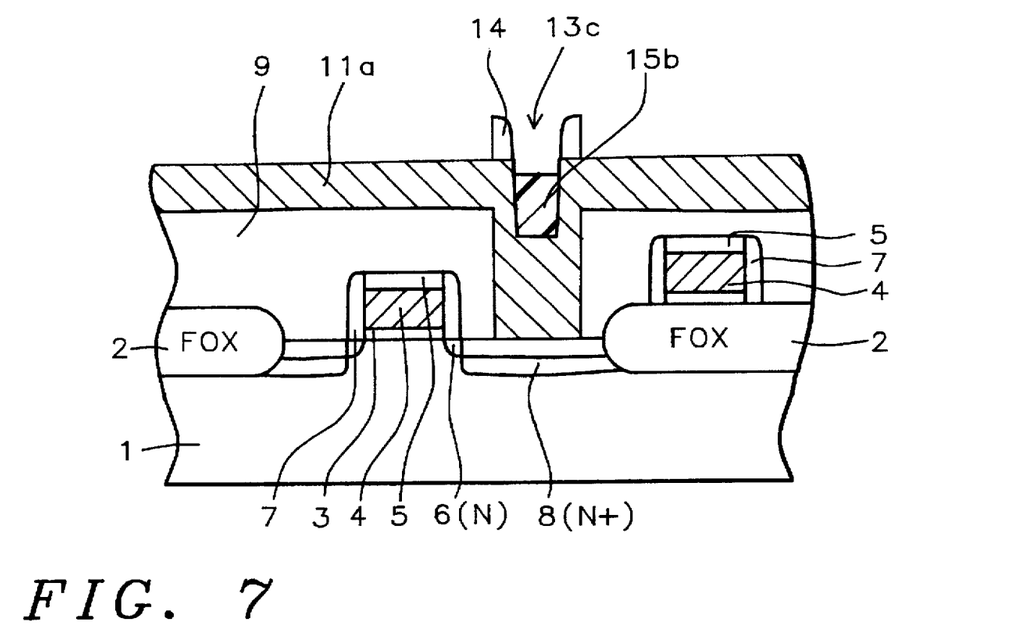

Silicon nitride layer, 12, is next removed using a hot phosphoric acid solution, followed by the application of photoresist layer, 15a, to a thickness between about 8000 to 12000 Angstroms, schematically shown in FIG. 6. A blanket exposure of photoresist layer, 15a, is performed at an dose or energy needed to to convert a top portion of photoresist layer, 15a, to a photoresist layer that will be soluble in developer. The exposure dose was therefore chosen to leave the photoresist layer, 15a, unexposed in trench 13c. Therefore after development of the exposed portion of photoresist layer, 15a, an unexposed, undeveloped, photoresist plug, 15b, remains in trench, 13c. This is shown schematically in FIG. 7.

Figure 8:
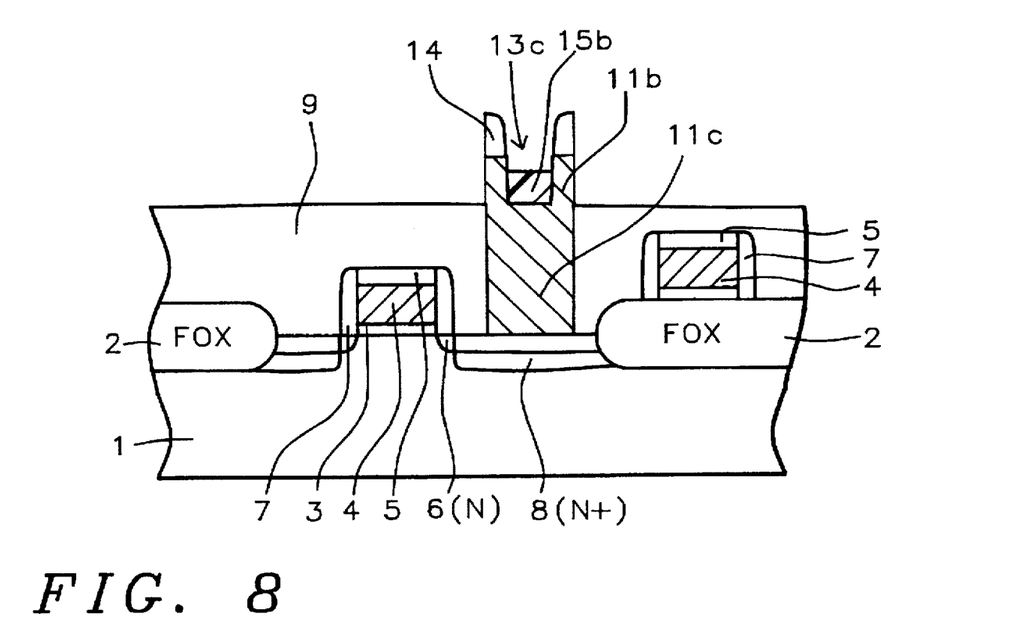

Patterning to create the storage node electrode shape is next addressed. Another, selective, (removing polysilicon at a faster rate then removing silicon oxide or photoresist), blanket, anisotropic RIE procedure, using $Cl_2$ as an etchant, is used to create the storage node electrode shape. The shape of the polysilicon columns, 11b, were defined using silicon oxide spacers, 14, as a mask, while the portion of the second polysilicon layer, 11c, to be used for contact to underlying source and drain region, 8, was protected during the $Cl_2$ RIE procedure, by photoresist plug, 15b. The creation of the storage node electrode shape, was accomplished without the use of a photomasking procedure. The spacing between polysilicon columns, 11b, critical to obtaining narrow width, STC structures, needed for high density DRAM designs, again is equal to the width of second narrow hole, 13b. This is schematically shown in FIG. 8.

Figure 9:
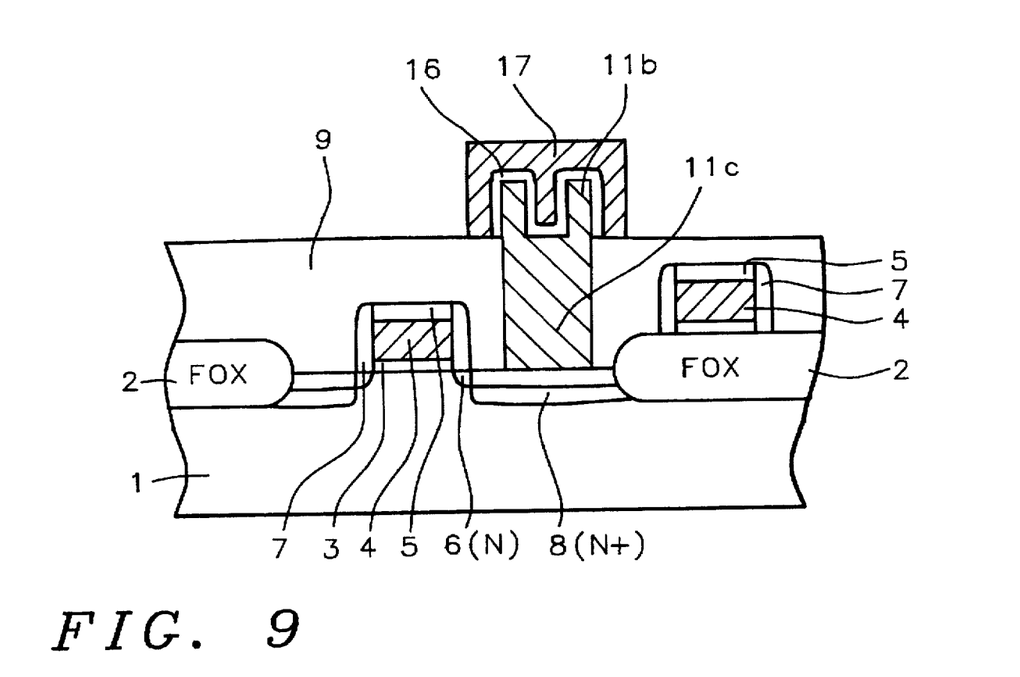

Photoresist plug, 15b, is removed via plasma oxygen asking procedures, followed by removal of silicon oxide spacers, 14, via use of a dilute, or buffered hydrofluoric acid solution. FIG. 9, schematically shows the completion of the STC structure. First a dielectric layer, 16, is formed, overlying the storage node electrode, comprised of polysilicon columns 11b, overlying the bottom portion of second polysilicon layer, 11c. Dielectric layer, 16, can be an insulator layer possessing a high dielectric constant, such as $Ta_2O_5$, obtained via r.f sputtering techniques, at a silicon oxide equivalent thickness between about 10 to 100 Angstroms. Dielectric layer, 16, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished using the situ doping, deposition procedure, via the addition of phosphine to a silane ambient. Photolithographic and RIE procedures, using $Cl_2$ as an etchant, are next employed to create polysilicon upper electrode, or plate electrode, 17, shown schematically in FIG. 9. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first silicon oxide, and a first polysilicon layer, insulator sidewall spacers, formed from a second silicon oxide layer, a source and drain region, and an overlying STC structure; with a storage node electrode, a dielectric layer, and an overlying plate electrode, and with the upper portion of said storage node electrode, comprised of polysilicon columns, with a narrow space between said polysilicon columns, and extending above a lower portion of said storage node electrode, which is used for contact to said source and drain regions of said underlying transistor, comprising the steps of:

depositing a third silicon oxide layer on said underlying transistor, of said DRAM device;

opening a contact hole, in said third silicon oxide layer, to expose top surface of said source and drain regions, of said underlying transistor;

depositing a second polysilicon layer on top surface of said third silicon oxide layer, and on top surface of said source and drain regions, exposed in said contact hole;

depositing a silicon nitride layer on said second polysilicon layer;

opening a first narrow hole, in said silicon nitride layer, exposing a first region, of said second polysilicon layer;

depositing a fourth silicon oxide layer on said silicon nitride layer, and in said first narrow hole, in said silicon nitride layer;

anisotropic etching of said fourth silicon oxide layer, to form silicon oxide spacers on the sides of said first narrow hole, creating second narrow hole, smaller in width then said first narrow hole, and exposing a second region of said second polysilicon layer, smaller in width then said first region of said second polysilicon layer;

anisotropic etching of a top portion of said second region of said polysilicon layer, using said second narrow hole as a mask, to create a trench in top portion of said second polysilicon layer, overlying an unetched, bottom portion of said second polysilicon layer, in said contact hole;

removal of said silicon nitride layer, exposing top surface of said second polysilicon layer;

applying a photoresist layer on said top surface of said second polysilicon layer, and on said silicon oxide spacers, while applying a thicker photoresist layer on bottom portion of said second polysilicon layer, exposed in said trench;

exposure of said photoresist layer overlying said second polysilicon layer, and of said photoresist layer overlying said silicon oxide spacers, while leaving said thicker photoresist layer, in said trench, unexposed;

removal of exposed said photoresist layer from top surface of said second polysilicon layer, and from said silicon oxide spacers, while leaving a photoresist plug, of unexposed, said thicker photoresist layer, in said trench;

anisotropic etching of said second polysilicon layer, not covered by said silicon oxide spacers, and not covered by said photoresist plug, in said trench, to create said storage node electrode, comprised of: said upper portion of said storage node electrode, with said polysilicon columns, underlying said silicon oxide spacers, with a narrow space between said polysilicon columns, equal in width to said second narrow hole; and comprised of said lower portion of said storage node electrode, with said bottom portion of said second polysilicon layer, in said contact hole, underlying said polysilicon columns, contacting said source and drain region of said underlying transistor;

removal of said photoresist plug, in said trench, of said storage node electrode;

removal of said silicon oxide spacers, overlying said polysilicon columns, of said storage node electrode;

forming said dielectric layer on said storage node electrode;

depositing a third polysilicon layer on said dielectric layer; and patterning of said third polysilicon layer to form said plate electrode of said STC structure.

2. The method of claim 1, wherein said third silicon oxide layer is deposited using LPCVD or PECVD procedures, at a temperature between about 700° to 750° C., to a thickness between about 3000 to 8000 Angstroms.

3. The method of claim 1, wherein said contact hole is formed in said third silicon oxide layer, via RIE procedures, using $CHF_3$ as an etchant, to a depth between about 3000 to 8000 Angstroms.

4. The method of claim 1, wherein said second polysilicon layer is deposited using LPCVD procedures, at a temperature between about 500° to 700° C., to a thickness between about 3000 to 8000 Angstroms.

5. The method of claim 1, wherein said silicon nitride layer is deposited using LPCVD or PECVD procedures, at a temperature between about 700° to 750° C., to a thickness between about 1000 to 2000 Angstroms.

6. The method of claim 1, wherein said first narrow hole, in said silicon nitride layer, is formed via anisotropic RIE procedures, using $CHF_3$ as an etchant.

7. The method of claim 1, wherein said silicon oxide spacers are formed via deposition of a fourth silicon oxide layer, via LPCVD or PECVD procedures, to a thickness between about 1000 to 2500 Angstroms, followed by an anisotropic RIE procedure, using $CHF_3$ as an etchant, to create said silicon oxide spacers.

8. The method of claim 1, wherein the width of said second narrow hole, is narrower in width then said first narrow hole, by the thickness of said silicon oxide spacers.

9. The method of claim 1, wherein said trench, in top portion of said second polysilicon layer, is formed via anisotropic RIE procedures, using $Cl_2$ as an etchant, with the depth of said trench, in top portion of said second polysilicon layer, between about 2000 to 5000 Angstroms, and with a width equal to the width of said second narrow hole.

10. The method of claim 1, wherein the thickness of said photoresist layer on said second polysilicon layer, and on said silicon oxide spacers, is between about 8000 to 12000 Angstroms, while the thickness of said thicker photoresist layer, on bottom portion of said second polysilicon layer, in said trench, is between about 13000 to 15000 Angstroms.

11. The method of claim 1, wherein said storage node electrode is formed via anisotropic RIE procedures, using $Cl_2$ as an etchant.

12. The method of claim 1, wherein the space between said polysilicon columns, is equal in width to the width of said second narrow hole.

13. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

14. The method of claim 1, wherein said dielectric layer is $Ta_2O_5$, obtained via r.f. sputtering techniques, at a thickness between about 10 to 100 Angstroms.

15. The method of claim 1, wherein said third polysilicon layer, used for creation of said plate electrode of said STC structure, is deposited using LPCVD procedures, at a temperature between about 500° to 700° C., to a thickness between about 1000 to 2000 Angstroms.

16. A method of fabricating a stacked capacitor structure, (STC), for a DRAM device, in which the surface area of the storage node electrode is increased via use of a storage node electrode configuration, consisting of an upper portion of said storage node electrode, comprised of polysilicon columns, with a narrow space between said polysilicon columns, and with said polysilicon columns extending above the top surface of a lower portion of said storage node electrode, with said lower portion of said storage node electrode residing in a contact hole, and contacting a region of an underlying transistor, comprising the steps of:

depositing a first silicon oxide layer on said underlying transistor;

opening a contact hole in said first silicon oxide layer, to expose top surface of said region of underlying transistor;

depositing a first polysilicon layer on top surface of said first silicon oxide layer, and on said top surface of said underlying transistor region, exposed in said contact hole;

depositing a silicon nitride layer on said first polysilicon layer;

opening a first narrow hole in said silicon nitride layer, exposing a first region of said first polysilicon layer;

depositing a second silicon oxide layer on said silicon nitride layer, and in said first narrow hole, in said silicon nitride layer;

anisotropic etching of said second silicon oxide layer, to form silicon oxide spacers, on the sides of said first narrow hole, creating a second narrow hole, smaller in width then said first narrow hole, and exposing a second region of said first polysilicon layer, smaller in width then said first region of said first polysilicon layer;

anisotropic etching of a top portion of said second region of said first polysilicon layer, exposed in said second narrow hole, to create a trench in top portion, of said second region, of said first polysilicon layer, leaving underlying bottom portion of said first polysilicon layer, in said contact hole, unetched;

removal of said silicon nitride layer, exposing top surface of said first polysilicon layer;

applying a photoresist layer on top surface of said first polysilicon layer, and on said silicon oxide spacers, while applying a thicker photoresist layer on the bottom portion of said first polysilicon layer, exposed in said trench;

exposure of said photoresist layer on top surface of said first polysilicon layer, and of said photoresist layer on said silicon oxide spacers, while leaving said thicker photoresist layer, in said trench, unexposed;

removal of exposed said photoresist layer from top surface of said first polysilicon layer, and from said silicon oxide spacers, while leaving a photoresist plug, of unexposed, thicker photoresist layer, in said trench;

anisotropic etching of said first polysilicon layer, not covered by said silicon oxide spacers, and not covered by said photoresist plug, to create said storage node electrode, comprised of: said upper portion of said storage node electrode, consisting of said polysilicon columns, underlying said silicon oxide spacers, with a narrow space between said polysilicon columns, equal in width to said second narrow hole; and comprised of said lower portion of said storage node electrode, consisting of said bottom portion of said first polysilicon layer, in said contact hole, underlying said polysilicon columns, and contacting said region of underlying transistor;

removal of said photoresist plug, in said trench;

removal of said silicon oxide spacers;

forming a dielectric layer on top surface of said storage node electrode;

depositing a second polysilicon layer on said dielectric layer; and patterning of said second polysilicon layer to form plate electrode, of said STC structure.

17. The method of claim 16, wherein said first silicon oxide layer is deposited using LPCVD or PECVD procedures, at a temperature between about 700° to 750° C., to a thickness between about 3000 to 8000 Angstroms.

18. The method of claim 16, wherein said contact hole is formed in said first silicon oxide layer, to a depth between about 3000 to 8000 Angstroms, via RIE procedures, using $CHF_3$ as an etchant.

19. The method of claim 16, wherein said first polysilicon layer is deposited using LPCVD procedures, at a temperature between about 500° to 700° C., to a thickness between about 3000 to 8000 Angstroms.

20. The method of claim 16, wherein said silicon nitride layer is deposited using LPCVD or PECVD procedures, at a temperature between about 700° to 750° C., to a thickness between about 1000 to 2000 Angstroms.

21. The method of claim 16, wherein said first narrow hole, is opened in said silicon nitride layer via anisotropic RIE procedures, using $CHF_3$ as an etchant.

22. The method of claim 16, wherein said silicon oxide spacers are created via deposition of a second silicon oxide layer, using LPCVD or PECVD procedures, to a thickness between about 1000 to 2500 Angstroms, followed by anisotropic RIE procedures, using $CHF_3$ as an etchant, to form said silicon oxide spacers.

23. The method of claim 16, wherein the width of said second narrow hole, is narrower then the width of said first narrow hole, by the thickness of said silicon oxide spacers.

24. The method of claim 16, wherein said trench, is formed via anisotropic RIE procedures, using $Cl_2$ as an etchant, to a depth, in said first polysilicon layer, of between about 2000 to 5000 Angstroms, with a width equal to the width of said second narrow hole.

25. The method of claim 16, wherein the thickness of said photoresist layer, on said first polysilicon layer, and on said silicon oxide spacers, is between about 8000 to 12000 Angstroms, while the thickness of said thicker photoresist layer, on bottom portion of said first polysilicon layer, in said trench, is between about 13000 to 15000 Angstroms.

26. The method of claim 16, wherein said storage node electrode is formed via anisotropic RIE procedures of said first polysilicon layer, using $Cl_2$ as an etchant.

27. The method of claim 16, wherein the space between said polysilicon columns is equal to the width of said second narrow hole.

28. The method of claim 17, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

29. The method of claim 16, wherein said thin dielectric layer is $Ta_2O_5$, deposited using r.f. sputtering procedures, to a thickness between about 10 to 100 Angstroms.

30. The method of claim 16, wherein said second polysilicon layer is deposited using LPCVD procedures, at a temperature between about 500° to 700° C., to a thickness between about 1000 to 2000 Angstroms.

31. The method of claim 16, wherein said plate electrode is created via RIE of said second polysilicon layer, using $Cl_2$ as an etchant.

* * * * *